US007893857B2

(12) United States Patent
Kim

(10) Patent No.: US 7,893,857 B2
(45) Date of Patent: Feb. 22, 2011

(54) ANALOG TO DIGITAL CONVERTER USING SUCCESSIVE APPROXIMATION

(75) Inventor: Sung Mook Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 32 days.

(21) Appl. No.: 12/345,880

(22) Filed: Dec. 30, 2008

(65) Prior Publication Data

US 2009/0207065 A1 Aug. 20, 2009

(30) Foreign Application Priority Data

Feb. 14, 2008 (KR) .................. 10-2008-0013686

(51) Int. Cl.
*H03M 1/12* (2006.01)
(52) U.S. Cl. ..................... 341/155; 341/172
(58) Field of Classification Search ............... 341/155, 341/161, 141, 172
See application file for complete search history.

(56) References Cited

U.S. PATENT DOCUMENTS 6,281,828 B1 * 8/2001 Kimura et al. ............ 341/155
6,445,329 B1 * 9/2002 Abassi et al. ............ 341/156
6,686,863 B1 * 2/2004 Jaussi et al. ............ 341/158
6,919,837 B2 * 7/2005 Harada et al. ............ 341/163
7,176,816 B2 * 2/2007 Koerner et al. ............ 341/120
7,477,179 B2 * 1/2009 Kawano .................. 341/161
7,564,395 B2 * 7/2009 Murayama et al. ...... 341/156

FOREIGN PATENT DOCUMENTS

| JP | 2005-012250 A | 1/2005 |
| KR | 1020040087102 A | 10/2004 |
| KR | 1020080001780 A | 1/2008 |

* cited by examiner

*Primary Examiner*—Peguy JeanPierre
(74) *Attorney, Agent, or Firm*—Ladas & Parry LLP

(57) ABSTRACT

Disclosed is a flash analog to digital converter (ADC) capable of reducing area requirements and using successive approximation. The ADC includes a reference voltage generating unit receiving an external voltage and outputting M reference voltages. A reference voltage selecting unit outputs N reference voltages less than the number of the voltages outputted by the reference voltage generating unit according to a supplied control signal. A digital signal output unit compares the N reference voltages outputted by the reference voltage selecting unit with an external analog input signal and outputs the comparison result as an N-bit digital signal.

18 Claims, 7 Drawing Sheets

US 7,893,857 B2

ANALOG TO DIGITAL CONVERTER USING SUCCESSIVE APPROXIMATION

CROSS-REFERENCE TO RELATED APPLICATIONS

The present application claims priority to Korean patent application number 2008-0013686 filed on Feb. 14, 2008 which is incorporated herein by reference in its entirety.

BACKGROUND OF THE INVENTION

The present invention relates generally to an analog to digital converter, and more particularly to an analog to digital converter based on a successive approximation algorithm (SAA).

In general, an analog to digital converter (ADC) is a circuit for converting an analog input signal to a digital signal. A flash-type ADC is a particular type of ADC featuring a high processing speed and therefore widely used for processing video signals.

A conventional ADC includes multiple-reference voltages generator 10, a comparing unit 12, and an encoder 14 as shown in FIG. 1.

The multiple-reference voltages generator 10 includes a plurality of resistors connected in series outputting a plurality of reference voltages by dividing a reference voltage Vref and a ground voltage VSS. The number of the resistors is determined according to the number of the reference voltages to be outputted, and at least $2^N$ resistors are provided and $2^N-1$ reference voltages are outputted supposing that the ADC is a circuit outputting N-bit data (where N is a natural number).

The comparing unit 12 is equipped with $2^N-1$ comparators, which is the same as the number of reference voltages. Each comparator outputs a high or low signal by comparing an input signal Vin to a reference voltage.

The encoder 14 combines and encodes the outputs of the comparing unit 12 into digital values to be outputted.

The conventional ADC, as shown in FIG. 1, requires the number of comparators to be equal to number of reference voltages. The conventional ADC, as shown in FIG. 1, is capable of converting data at a fast rate, however the conventional ADC has very high current consumption and requires a wider area, which is proportional to the number of comparators, for the purpose of layout.

Due to these limitations, that is the high current consumption and large layout size, the conventional ADC, as shown in FIG. 1, is not suitable for the requirements of a mobile machine.

SUMMARY OF THE INVENTION

There is provided an analog to digital converter based on a successive approximation algorithm (SAA) according to the present invention.

The present invention provides an analog to digital converter, which improves overall layout and current consumption by reducing the number of comparators which is necessary for data conversion.

An analog to digital converter according to an embodiment of the present invention comprises a reference voltage generating unit inputting an external voltage and outputting M reference voltages (M is a natural number); a reference voltage selecting unit outputting N reference voltages less than the number of the voltages outputted by the reference voltage generating unit in response to a control signal; and a digital signal output unit comparing the N reference voltage outputted by the reference voltage selecting unit with an analog input signal inputted from the outside respectively to output the comparison result as an N-bit digital signal and feedbacking the digital signal to the reference voltage selecting unit as the control signal.

Preferably, the reference voltage generating unit outputs $(2^N-1)$ reference voltages by dividing the external voltage into equal parts.

The reference voltage generating unit may comprise a first voltage dividing unit outputting M first dividing voltage by dividing the external voltage into equal parts; a second voltage dividing unit connected to the first voltage dividing unit in parallel to output M second dividing voltage by dividing the external voltage into equal parts; and a reference voltage output unit outputting M reference voltages by averaging the first and second dividing voltages.

The first and second voltage dividing units are connected to $2^N$ equal resistors in series to form $2^N-1$ nodes; the reference voltage output unit includes $2^N-1$ voltage averaging units to which the resistors having equal resistance are connected between each of the nodes.

The reference voltage selecting unit comprises a transfer unit transferring N reference voltages of the M reference voltages to the digital signal output unit; and a decoding unit decoding the control signal to output it as a decoding signal for controlling the transfer unit.

The transfer unit comprises transfer gates of same number as the number of the reference voltages outputted by the reference voltage generating unit, and turns on the corresponding transfer gate if the decoding signal is enabled.

The transfer unit comprises a first transfer unit transferring the central reference voltage of the M reference voltages and a second transfer unit transferring the remaining reference voltages under a control of the decoding signal.

The signal of upper most bit to N−1 bit of the digital signal outputted by the output unit is feedbacked to the decoding unit in order to output $2^N-2$ decoding signals.

The decoding unit comprises N−1 decoders, and each of the decoders is inputted with sequentially accumulated digital signal from upper most bit to lower bits.

The output unit comprises comparators of the same number as the number of the reference voltages outputted by the reference voltage selecting unit and the comparator compares the corresponding reference voltage with the analog signal to output the comparison result.

The comparator can comprise a first operational amplifier including an NMOS transistor differential input pair; a second operational amplifier including a PMOS transistor differential input pair; an operational amplifier drive selecting unit turning off alternatively the first operational amplifier and the second operational amplifier in accordance with the voltage level of the input signal; and transfer gates equipped with the number corresponding to the number of the operational amplifier to transfer the outputs of the operational amplifiers selectively.

The operational amplifier drive selecting unit comprises a first inverter inverting the input signal to output it as a driving signal of the second operational amplifier; and a second inverter inverting the output signal of the first inverter to output it as a driving signal of the first operational amplifier.

An flash analog to digital converter according to an embodiment of the present invention comprises a reference voltage transfer unit receiving a plurality of reference voltages and transferring N reference voltages in response to a control signal; a comparing unit comparing N reference voltages outputted by the reference voltage transfer unit with an analog input signal inputted from the outside respectively to output the comparison result as N-bit digital signal; and a control signal generating unit generating the control signal by combining the digital signal.

Preferably, the reference voltage transfer unit comprises transfer gates of same number as the number of the reference voltages inputted and turns on the corresponding transfer gate if the control signal is enabled.

The reference voltage transfer unit may comprise a first transfer unit transferring the reference voltage having central voltage level of the plurality of reference voltages and a second transfer unit transferring the remaining reference voltages by the control signal.

The control signal generating unit receives signals of upper most bit to (N−1) bit of the digital signal and outputs $2^N-2$ control signals.

The control signal generating unit comprises N−1 decoders and each decoder is inputted with sequentially accumulated digital signal from upper most bit to lower bits.

The comparing unit comprises N comparators and each of the comparators compares the corresponding reference voltage with the analog signal to output the comparison result.

According to the present invention, it is possible to reduce area and current consumption of the analog to digital converter by reducing the number of the comparators provided therein. Therefore, the analog to digital converter is suitable for use in the mobile machine.

DESCRIPTION OF SPECIFIC EMBODIMENTS

Hereinafter, preferred embodiments of the present invention will be described in detail with reference to the accompanying drawings.

The present invention discloses a configuration that applies a successive approximation algorithm and defines a digital signal that is finally outputted by feedbacking the digital signal according to an order such as an upper-most bit, second upper bit, third upper bit and so on.

Figure 1:
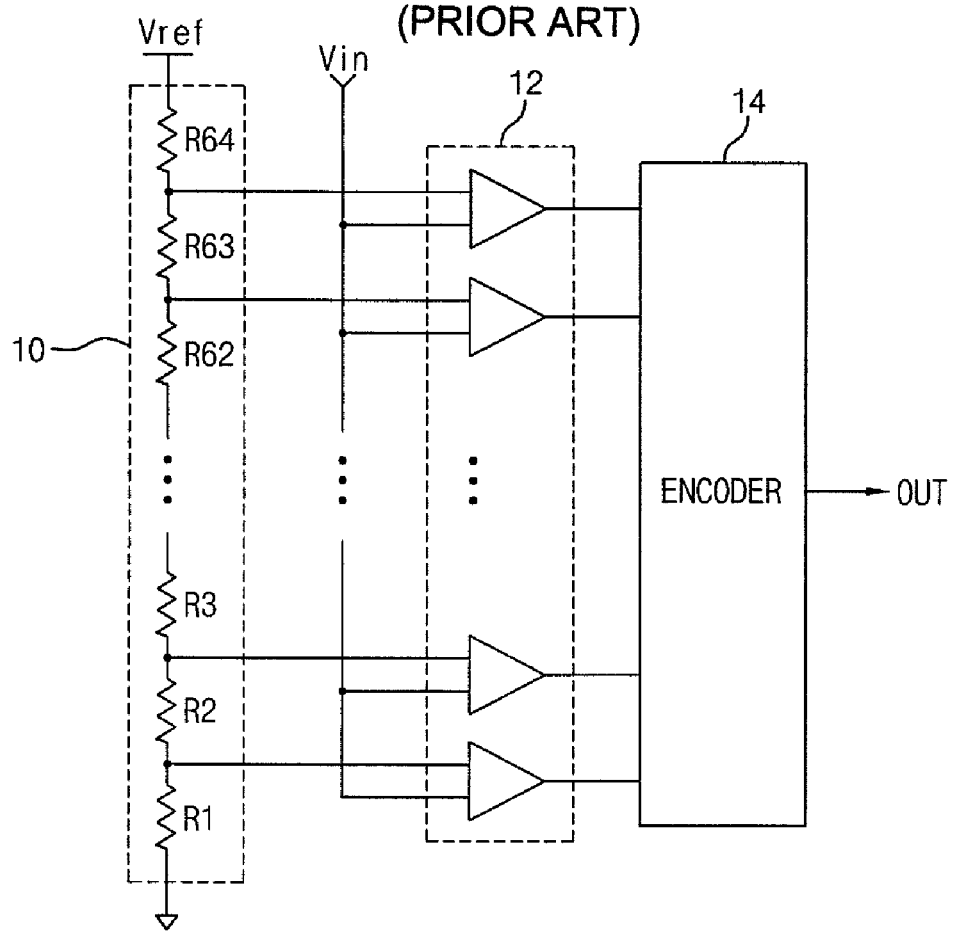
FIG. 1 is a block diagram showing a flash analog to digital converter according to a related art.
Figure 2:
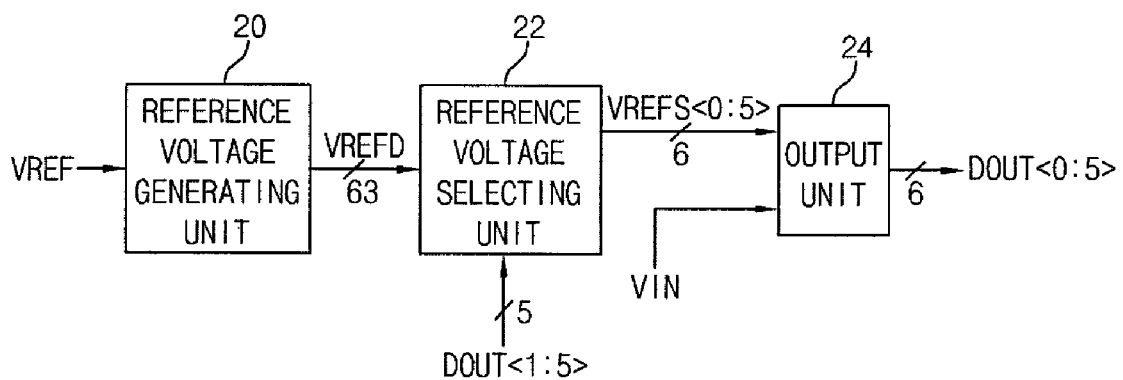
FIG. 2 is a block diagram showing 6-bit flash analog to digital converter according to one embodiment of the present invention.

FIG. 2 shows a block diagram illustrating the ADC according to one embodiment of the present invention that outputs 6-bit data. Although the data in the disclosed embodiment of the present invention is outputted in 6-bit, the number of bits of data outputted is not limited to only 6-bit and may be set to various N bit outputs (N is a natural number greater than 2).

The ADC in FIG. 2 includes a reference voltage generating unit 20, a reference voltage selecting unit 22, and an output unit 24.

The reference voltage generating unit 20 receives a reference voltage Vref and outputs 63 reference voltages VREFD having a level that falls between the reference voltage Vref and a ground voltage Vss. The reference voltages are scaled to have a uniform difference from each other. Accordingly, the ADC having N-bit output data outputs $2^N-1$ reference voltages.

The reference voltage selecting unit 22 receives the 63 reference voltages VREFDs supplied from the reference voltage generating unit 20 and selects 6 reference voltages to be outputted as a selected reference voltage VRES<0:5> from the 63 reference voltages VREFDs. The reference voltage VREFS<0:5> is selected from the reference voltages VREFDs according to an upper 5 bits that are fed back to the reference voltage selecting unit 22, i.e., DOUT<1:5> of output signal DOUT<0:5> from the output unit 24.

The output unit 24 compares the reference voltage VREFS<0:5>, which is selected by the reference voltage selecting unit 22, with an analog signal VIN that is inputted externally and outputs the comparing results as an output signal DOUT<0:5>. The output signal DOUT<0:5> is a binary code digital signal The output signal DOUT<0:5> is such that a value of an upper most bit DOUT<5> is defined first and subsequent values of lower bits are sequentially defined according to the analog signal VIN inputted to the output unit 24. The reference voltage VREFS<0:5> outputted from the reference voltage selecting unit 22 is selected according to the successive approximation algorithm (SAA). Accordingly, the output DOUT<0:5> is determined by the output unit 24. The detailed operation thereon will now be explained.

Figure 3:
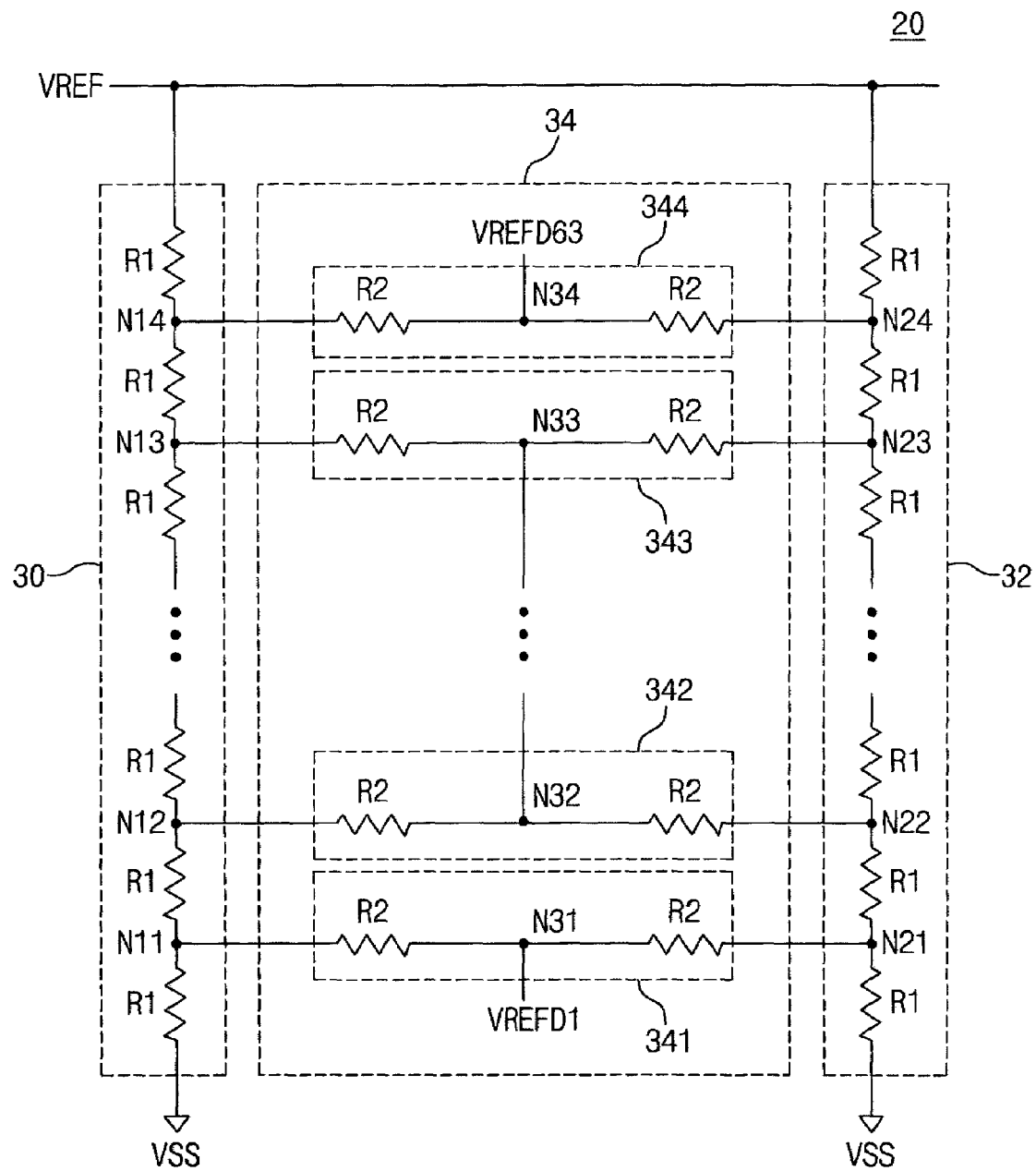
FIG. 3 is a circuit diagram showing one embodiment of the reference voltage generating unit 20 of FIG. 2.

The reference voltage generating unit 20 in FIG. 2 can be configured as shown in FIG. 3.

The reference voltage generating unit 20 includes voltage dividing units 30, 32 connected in parallel with respect to the reference voltage VREF that is externally applied. The reference voltage generating unit 20 also includes a reference voltage output unit 34 located between the voltage dividing units 30, 32 for outputting the reference voltages VREFDs<1: 63>.

The voltage dividing unit 30 is configured to include a resistor string across which the reference voltage VREF and the ground voltage VSS is applied. The resistor string has 64 resistors R1 having the same resistance and connected in series. The voltage dividing unit 32 has the same structure as the voltage dividing unit 30.

The reference voltage output unit 34 includes voltage averaging units 341, 342, 343, 344 connected between each node of the resistors provided within the voltage dividing units 30, 32 to average the divided voltage outputted from each of the nodes. For example, the first voltage averaging unit 341 includes two resistors R2 connected between a node N11 of the voltage dividing unit 30 and a node N21 of the voltage dividing unit 32, and averages the divided voltage of each node to output it as a reference voltage VREFD1 at a node N31. The remaining reference voltages VREFD2~VREFD63 are outputted in the same manner as VREFD1 and therefore a detailed description is omitted.

Although all the resistors R1 used in the voltage dividing unit 30, 32 have preferably same resistance, the voltage cannot be correctly divided using a simple voltage division method since the resistors will have slight deviations. Therefore, a structure can be proposed that averages the divided voltage by adding a resistor between the voltage dividing units 30, 32 so that the reference voltage can be computed more accurately.

Figure 4:
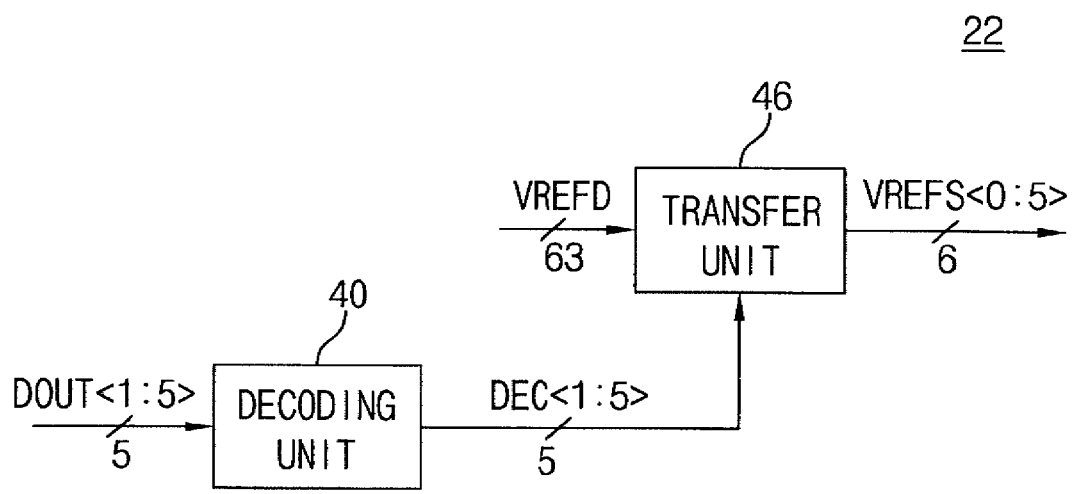
FIG. 4 and FIG. 5 are block diagrams showing one embodiment of the reference voltage selecting unit 22 of FIG. 2.
Figure 5:
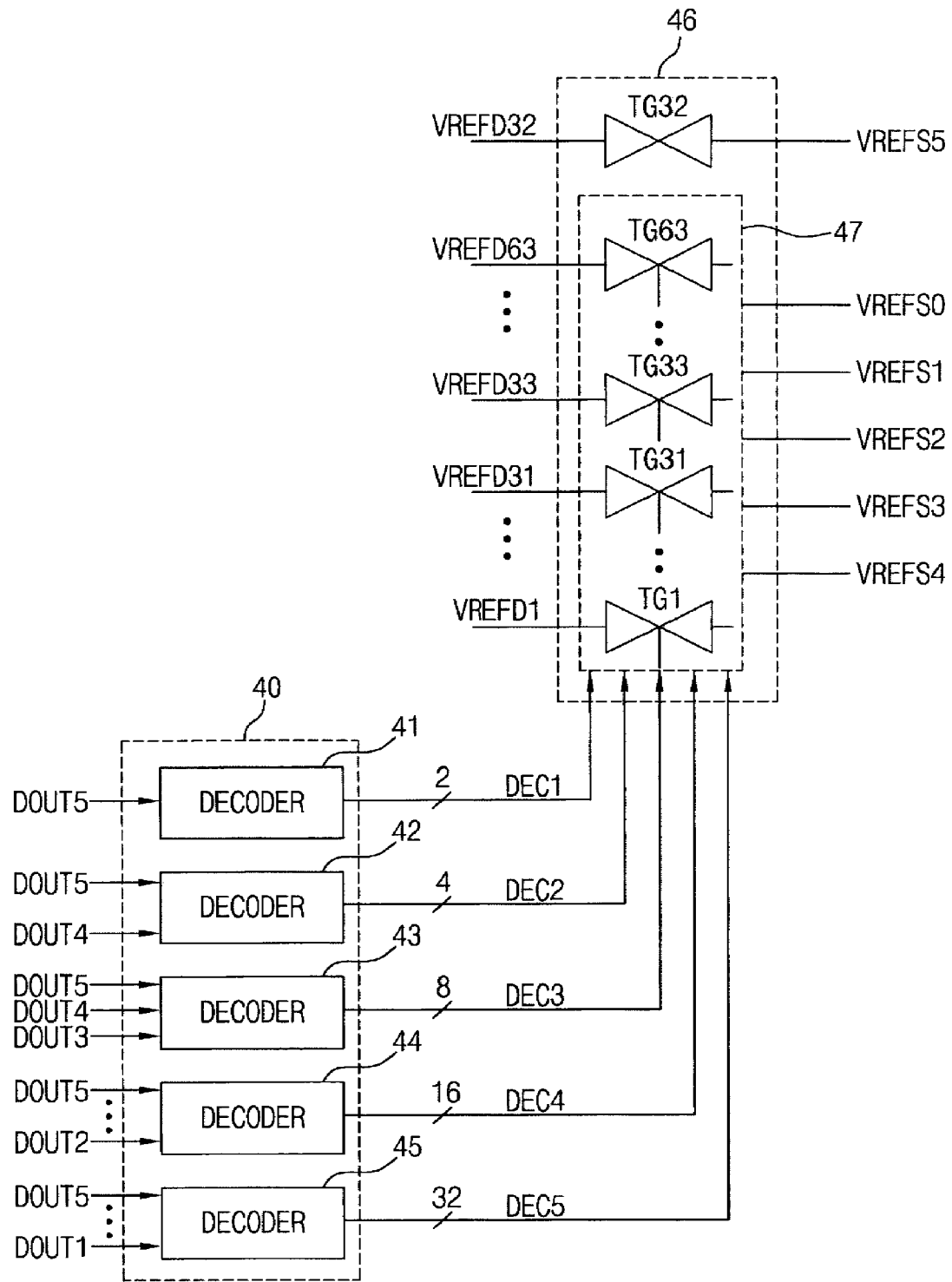

Meanwhile, referring to FIG. 4 and FIG. 5, a structure of the reference voltage selecting unit 22 of FIG. 2 will be described.

The reference voltage selecting unit 22 includes a decoding unit 40 that receives the fed back output signal DOUT<1:5> of the output signal DOUT<0:5> of the output unit 24 to decode and output the output signal DOUT<1:5> as a decoding signal DEC<1:5>. The reference voltage selecting unit 22 also includes a transfer unit 46 that selects partial reference voltages from the reference voltages VREFDs outputted by the reference voltage generating unit 20 in accordance with the decoding signal DEC<1:5> and outputs them to the output unit 24.

The decoding unit 40 includes a decoder 41 that receives the upper most bit (MSB) DOUT5 of the output signal DOUT<0:5> outputted by the output unit 24 and outputs a 2-bit decoding signal DEC1. The decoding unit 40 also includes a decoder 42 that receives the upper most bit DOUT5 and a lower bit signal DOUT4 outputted from the output unit 24 and outputs a 4-bit decoding signal DEC2, a decoder 43 that receives the output signals DOUT5, DOUT4, DOUT3 outputted from the output unit 24 and outputs an 8-bit decoding signal DEC3, a decoder 44 that receives the output signal DOUT5, DOUT4, DOUT3, DOUT2 outputted from the output unit 24 and outputs a 16-bit decoding signal DEC4, and a decoder 45 that receives the output signal DOUT5, DOUT4, DOUT3, DOUT2, DOUT1 outputted from the output unit 24 and outputs a 32-bit decoding signal DEC5.

Each of the decoders 41~45 outputs $2^X$ decoding signals, where X is the number input signals received at each decoder. As a result, the decoding unit 40 outputs a total of 62 decoding signals as shown in FIG. 5.

The transfer unit 46 includes 63 transfer gates TG1-TG63. Transfer gate TG32 outputs the reference voltage VREFD32 as a reference voltage VREFS5 without any switching, while the remaining transfer gates TG1-TG31, TG33-TG63 are switched according to control of the decoding signal.

Herein, the transfer gate TG32 outputs the reference voltage VREFD32 having a potential corresponding to ½ the potential difference between the reference voltage VREF and the ground voltage VSS, and must always be turned on to transfer its value. Therefore, the transfer gate TG32 does not need to have a separate control signal.

The transfer unit 46 has a plurality of transfer gates TG1 to TG63 each matched to a corresponding reference voltage VREFD1 to VREFD63, and transfers the selected signals to the output unit 24 according to the decoding signals DEC<1:5>.

The remaining transfer gates 47, excluding transfer gate TG32, are controlled according to the decoding signals DEC<1:5>. Each control signal of the decoding signals DEC<1:5> causes only one transfer gate to turn on. According to the control signals of the decoding signals DEC<1:5>, 5 transfer gates are turned on.

Figure 6:
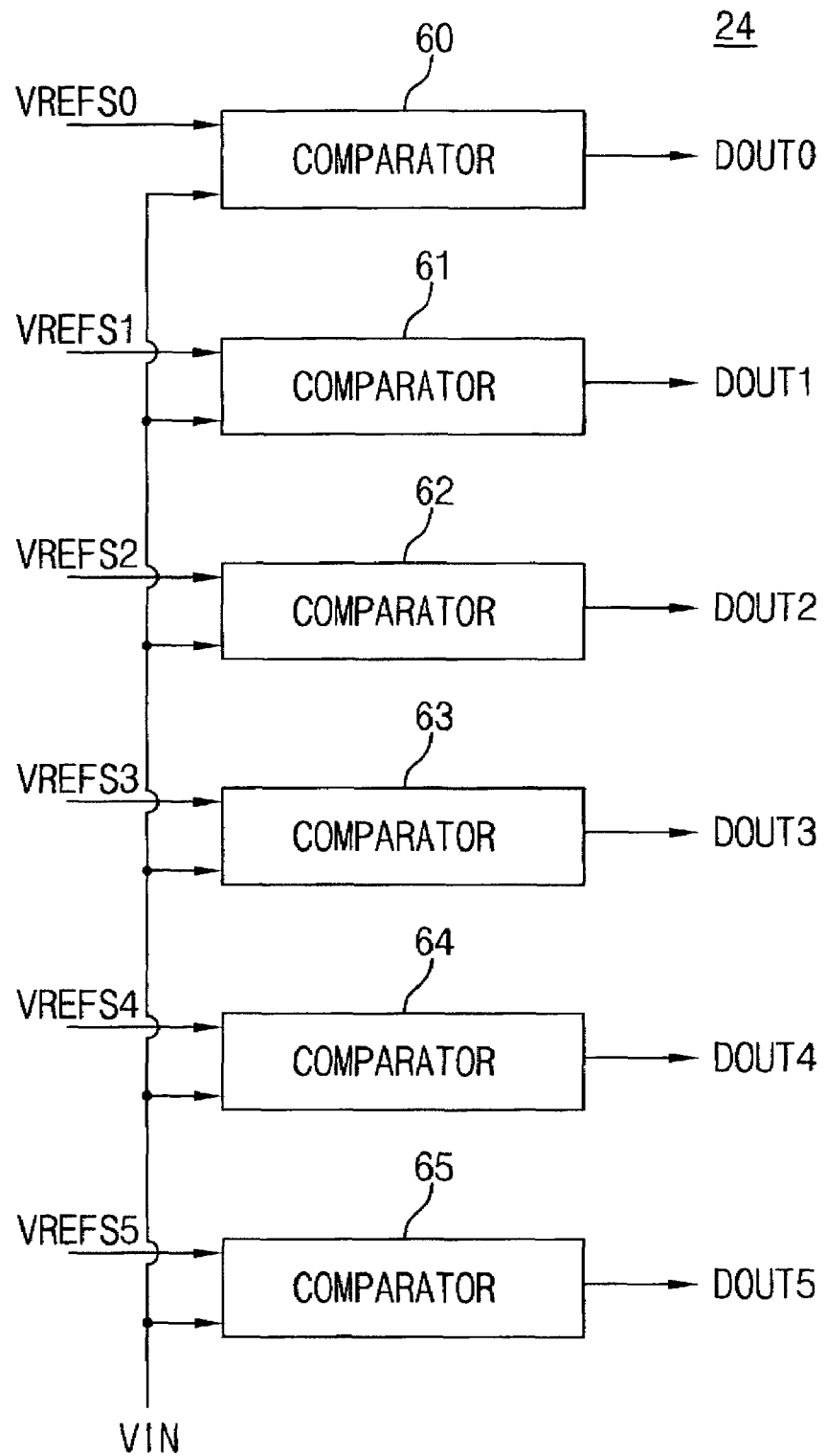
FIG. 6 is a block diagram showing one embodiment of the output unit 24 of FIG. 2.

The reference voltages selected by the transfer unit 46 are transferred to the output unit 24. The output unit 24 includes 6 comparators 60-65 as shown in FIG. 6. Each comparator 60-65 compares the inputted reference voltage with an external analog signal, i.e., input signal VIN, and outputs the output signal DOUT<0:5> having logic high or low values.

The reference voltage selection and output signal DOUT<1:5> fed back to the reference voltage selecting unit 22 from the output unit 24 will now be described.

The reference voltages VREFD1 to VREFD63 are divided so as to have a uniform difference and the reference voltage VREFD32 is half of the divided voltage scale.

The reference voltage VREFD32 is transferred to the comparator 65 as reference voltage VREFS5 through the transfer gate TG32 included in the transfer unit 46 of the reference voltage selecting unit 22. The comparator 65 outputs the output signal DOUT5 having a binary value of "1" or "0" according to a level of the input signal VIN by comparing the input signal VIN with the reference voltage VREFS5. The output signal DOUT5 is a upper most bit of the output signal DOUT<0:5>.

The output signal DOUT5 is fed back to the decoder 41 of the decoding unit 40. The decoder 41 generates a 2-bit decoding signal DEC1 and outputs 1 bit of the 2-bit decoding signal to transfer gates TG16 and TG48 respectively. The transfer gates TG16, TG48 are switched to transfer the reference voltages VREFD16, VREFD48 according to the decoding signal DEC1 from the decoder 41 so that the reference voltages VREFD16, VREFD48 are outputted as the reference voltage VREFS4. Herein, the potential of the reference voltage VREFD16 has an intermediate value between the reference voltage VREFD32 and the ground voltage VSS, and the potential of the reference voltage VREFD48 has an intermediate value between the reference voltage VREFD32 and the reference voltage VREF.

The reference voltage VREFS4 is determined according to a level of the output signal DOUT5 and inputted to the comparator 64 of the output unit 24. Reference voltage VREFS4 is determined according to the value of the output signal DOUT4 as shown in Table 1.

TABLE 1

|  | DOUT5 | VREFD |
|---|---|---|
| VREFS4 | 1 | 48 |
|  | 0 | 16 |

The reference voltage VREFS4 inputted as described above and the input signal VIN are compared by the comparator 64 and a value corresponding to the comparing result is outputted as output signal DOUT4. Herein, the output signal DOUT4 is a second upper bit of the output signal DOUT<0:5>.

The output signals DOUT5, DOUT4 determined as described above are fed back to the decoder 42. The decoder 42 outputs each bit of the 4-bit decoding signal DEC2 to one of the transfer gates TG56, TG40, TG24, TG8 respectively.

As a result, the reference voltage VREFS3 is determined according to a level of the output signals DOUT5 and DOUT4 and inputted to the comparator 63 of the output unit 24. Reference voltage VREFS3 is determined according to the value of output signals DOUT5 and DOUT4 as shown in Table 2 below.

TABLE 2

|  | DOUT5 | DOUT4 | VREFD |
|---|---|---|---|
| VREFS3 | 1 | 1 | 56 |
|  | 1 | 0 | 40 |
|  | 0 | 1 | 24 |
|  | 0 | 0 | 8 |

The above-mentioned SAA is repeated according to the fed back output signals so that the appropriate reference voltage VREFD is selected. The reference voltages VREFS2, VREFS1, VREFS0 are inputted to the comparators 62, 61, 60, respectively. The values of DOUT5~DOUT1 for determining the appropriate reference voltage VREFD for reference voltages VREFS2~VREFS0 are provided in Table 3 to Table 5 below.

TABLE 3

|  | DOUT5 | DOUT4 | DOUT3 | VREFD |
|---|---|---|---|---|
| VREFS2 | 1 | 1 | 1 | 60 |
|  | 1 | 1 | 0 | 52 |
|  | 1 | 0 | 1 | 44 |
|  | 1 | 0 | 0 | 36 |
|  | 0 | 1 | 1 | 28 |
|  | 0 | 1 | 0 | 20 |
|  | 0 | 0 | 1 | 12 |
|  | 0 | 0 | 0 | 4 |

TABLE 4

|  | DOUT5 | DOUT4 | DOUT3 | DOUT2 | VREFD |
|---|---|---|---|---|---|
| VREFS1 | 1 | 1 | 1 | 1 | 62 |
|  | 1 | 1 | 1 | 0 | 58 |
|  | 1 | 1 | 0 | 1 | 54 |
|  | 1 | 1 | 0 | 0 | 50 |
|  | 1 | 0 | 1 | 1 | 46 |
|  | 1 | 0 | 1 | 0 | 42 |
|  | 1 | 0 | 0 | 1 | 38 |
|  | 1 | 0 | 0 | 0 | 34 |
|  | 0 | 1 | 1 | 1 | 30 |
|  | 0 | 1 | 1 | 0 | 26 |
|  | 0 | 1 | 0 | 1 | 22 |
|  | 0 | 1 | 0 | 0 | 18 |
|  | 0 | 0 | 1 | 1 | 14 |
|  | 0 | 0 | 1 | 0 | 10 |
|  | 0 | 0 | 0 | 1 | 6 |
|  | 0 | 0 | 0 | 0 | 2 |

TABLE 5

|  | DOUT5 | DOUT4 | DOUT3 | DOUT2 | DOUT1 | VREFD |
|---|---|---|---|---|---|---|
| VREFS0 | 1 | 1 | 1 | 1 | 1 | 63 |
|  | 1 | 1 | 1 | 1 | 0 | 61 |
|  | 1 | 1 | 1 | 0 | 1 | 59 |
|  | 1 | 1 | 1 | 0 | 0 | 57 |
|  | 1 | 1 | 0 | 1 | 1 | 55 |
|  | 1 | 1 | 0 | 1 | 0 | 53 |
|  | 1 | 1 | 0 | 0 | 1 | 51 |
|  | 1 | 1 | 0 | 0 | 0 | 49 |
|  | 1 | 0 | 1 | 1 | 1 | 47 |
|  | 1 | 0 | 1 | 1 | 0 | 45 |
|  | 1 | 0 | 1 | 0 | 1 | 43 |
|  | 1 | 0 | 1 | 0 | 0 | 41 |
|  | 1 | 0 | 0 | 1 | 1 | 39 |
|  | 1 | 0 | 0 | 1 | 0 | 37 |
|  | 1 | 0 | 0 | 0 | 1 | 35 |
|  | 1 | 0 | 0 | 0 | 0 | 33 |
|  | 0 | 1 | 1 | 1 | 1 | 31 |
|  | 0 | 1 | 1 | 1 | 0 | 29 |
|  | 0 | 1 | 1 | 0 | 1 | 27 |
|  | 0 | 1 | 1 | 0 | 0 | 25 |
|  | 0 | 1 | 0 | 1 | 1 | 23 |
|  | 0 | 1 | 0 | 1 | 0 | 21 |
|  | 0 | 1 | 0 | 0 | 1 | 19 |
|  | 0 | 1 | 0 | 0 | 0 | 17 |
|  | 0 | 0 | 1 | 1 | 1 | 15 |
|  | 0 | 0 | 1 | 1 | 0 | 13 |
|  | 0 | 0 | 1 | 0 | 1 | 11 |
|  | 0 | 0 | 1 | 0 | 0 | 9 |
|  | 0 | 0 | 0 | 1 | 1 | 7 |
|  | 0 | 0 | 0 | 1 | 0 | 5 |
|  | 0 | 0 | 0 | 0 | 1 | 3 |
|  | 0 | 0 | 0 | 0 | 0 | 1 |

Figure 7:
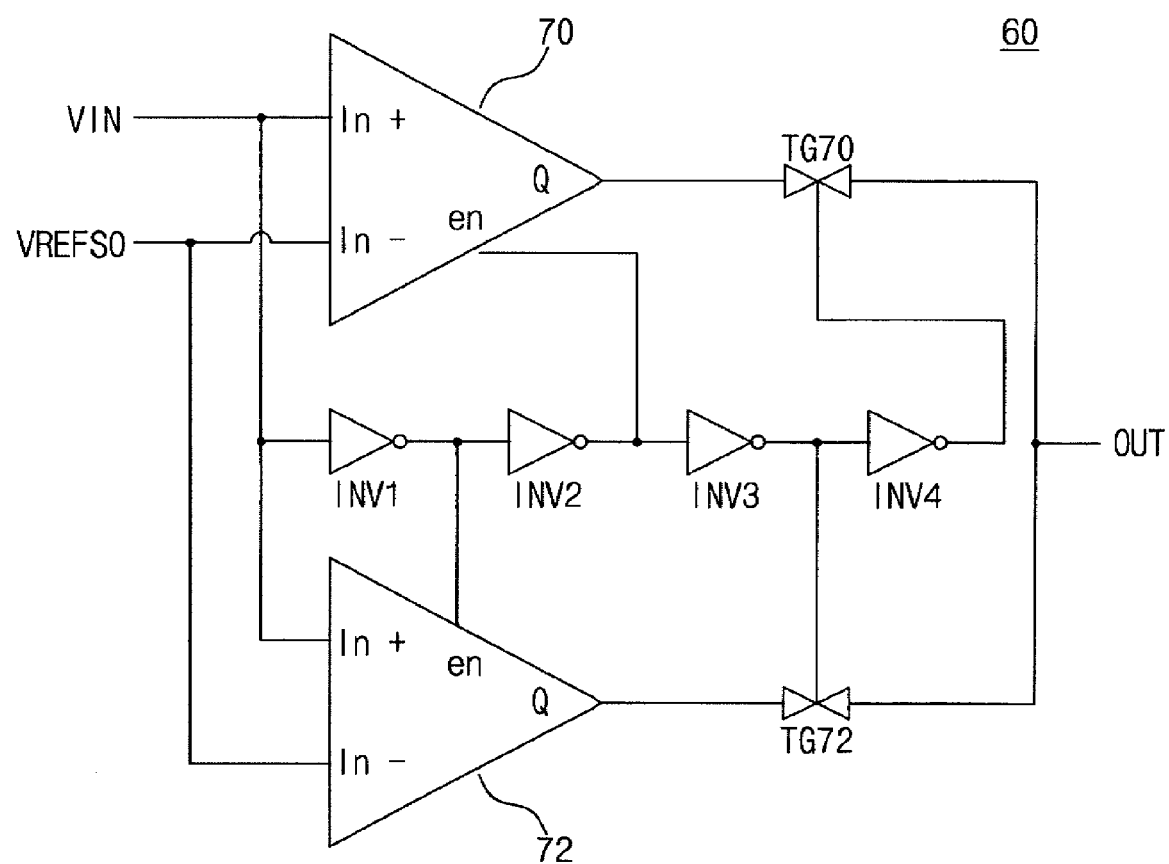
FIG. 7 is a detailed circuit diagram showing one embodiment of comparator of FIG. 6.

Meanwhile, FIG. 7 shows one embodiment of the comparator in FIG. 6.

The comparator 60 includes two operational amplifiers 70 (NMOS type) and 72 (PMOS type) having an NMOS or PMOS transistor differential input pair respectively, and two inverters INV1, INV2 for inverting the input voltage VIN to drive the operational amplifiers 70, 72 selectively. The comparator 60 also includes two transfer gates TG70, TG72 for transferring the output of the operational amplifiers 70, 72 selectively, and two inverters INV3, INV4 for inverting the output of the second inverter INV2 to drive the transfer gates TG70, TG72 selectively.

Herein, a range of the input voltage VIN can be divided into two sections. For example, the input voltage VIN can be constructively divided into a logical high or low level based on a logic threshold of the first inverter INV1 and the second inverter INV2.

If the input voltage VIN is greater than the logic threshold voltage of the inverters INV1, INV2, the first operational amplifier 70 will operate. The transfer gate TG70 is then turned on to transfer the output of the first operational amplifier 70.

In contrast, if the input voltage VIN is less than the logic threshold voltage of the inverters INV1, INV2, the second operational amplifier 72 will operate. The transfer gate TG72 is then turned on to transfer the output of the second operational amplifier 72.

In other words, the first operational amplifier 70 having an NMOS transistor differential input pair will operate if the voltage level of the input voltage VIN is greater than the logic threshed voltage of the inverters INV1, INV2, whereas the second operational amplifier 72 having a PMOS transistor differential input pair will operate in a condition opposite to that of the first operational amplifier 70.

By using such comparator 60 as described above, it is possible to reduce power consumption and increase speed.

One having skill in the related art will appreciate that the comparator of FIG. 7 is only one embodiment of the present invention and can be changed, altered, or substituted without departing from the spirit and scope of the present invention.

If the analog input signal VIN is applied, the upper most bit MSB is determined according to the input signal VIN. The reference voltage of the second upper bit MSB−1 is determined according to the feedback of the upper most bit MSB. Accordingly, the reference voltage of the (MSB−N)th bit is determined in accordance with its upper bit (MSB−N+1).

Figure 8:
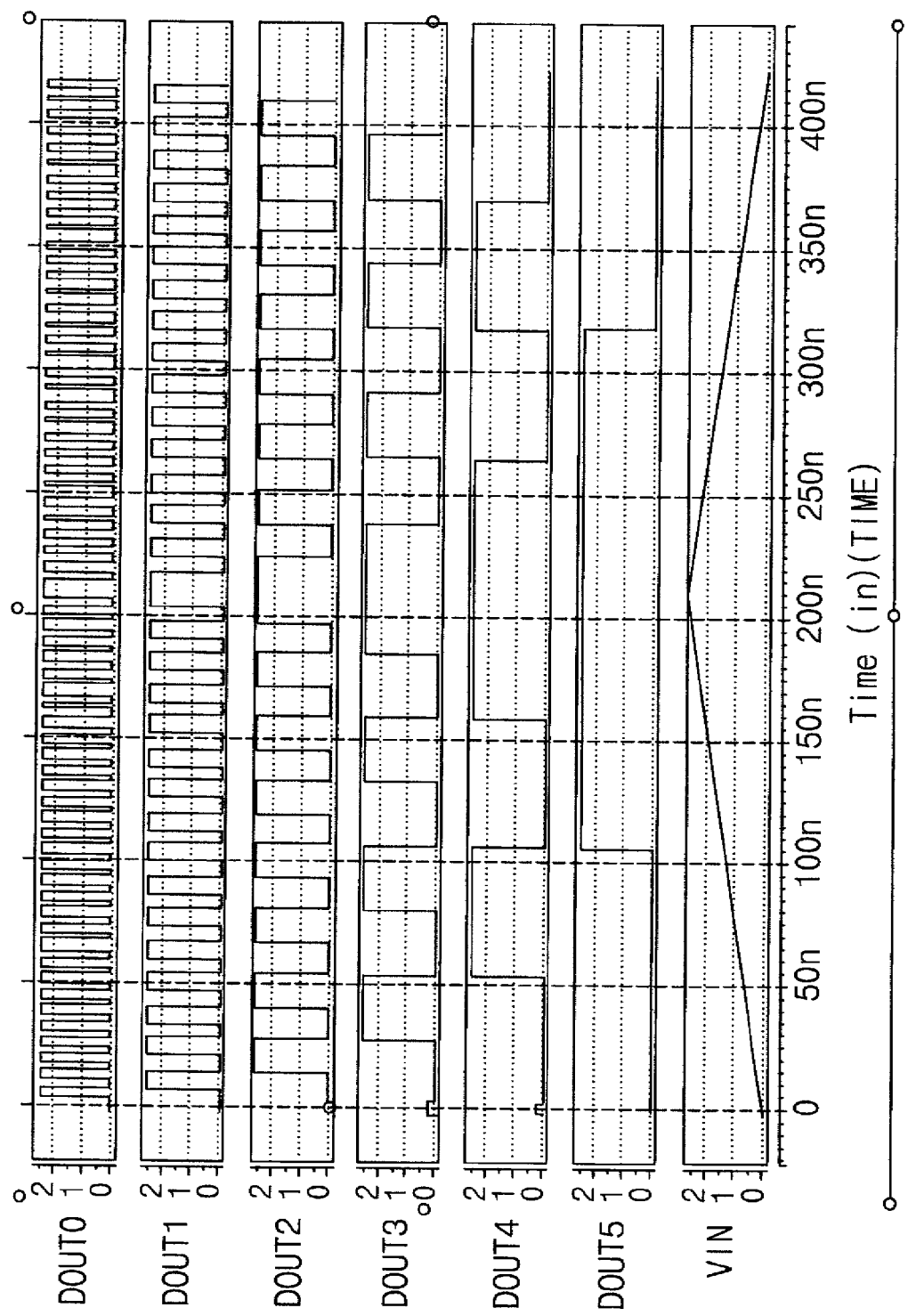
FIG. 8 is a waveform diagram showing a simulation result according to one embodiment of the present invention.

FIG. 8 is a waveform diagram showing a simulation result when an input VIN of an N bit analog to digital converter according to the present invention is a triangular wave.

The period of the triangular wave is 420 ns, i.e., 2.38 MHz. Therefore, the maximum conversion rate (MCR) is 128*2.38 Mhz=304 Msmaples/second, where 128 is the number of output codes outputted per one period. The analog to digital converter can be used after tuning it to meet particular use requirements.

Further, though the analog signal VIN used as an input in the embodiment of the present invention is exemplified as a voltage level, it is not limited to only such and may be embodied as a current or other similar analog signal.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An analog to digital converter, comprising:
a reference voltage generating unit receiving an external voltage and outputting M number of reference voltages (M being a natural number);
a reference voltage selecting unit outputting N number of reference voltages in response to a control signal, N being less than the number of the M reference voltages outputted by the reference voltage generating unit (N being a natural number); and
a digital signal output unit comparing each of the N reference voltages outputted by the reference voltage selecting unit with an externally inputted analog input signal to output a comparison result as an N-bit digital signal,
wherein the N-bit digital signal is fed back to the reference voltage selecting unit as the control signal,
wherein the reference voltage selecting unit comprises:
a transfer unit transferring N number of reference voltages selected from the M number of reference voltages from the reference voltage generating unit to the digital signal output unit; and
a decoding unit decoding the control signal to output the control signal as a decoding signal for controlling the transfer unit.

2. The analog to digital converter of claim 1, wherein the reference voltage generating unit outputs ($2^N-1$) reference voltages by dividing the external voltage into equal segments.

3. The analog to digital converter of claim 1, wherein the reference voltage generating unit comprises:
a first voltage dividing unit outputting M number of first divided voltages by dividing the external voltage into equal segments;
a second voltage dividing unit connected in parallel to the first voltage dividing unit outputting M number of second divided voltages by dividing the external voltage into equal segments; and
a reference voltage output unit outputting M reference voltages by averaging the first and second divided voltages.

4. The analog to digital converter of claim 3, wherein each of the first and second voltage dividing units comprises $2^N$ resistors having a same value connected in series to form $2^N-1$ nodes;
the reference voltage output unit includes $2^N-1$ voltage averaging units having resistors of equal resistance connected between each pair of the $2^N-1$ nodes of the first and second voltage dividing units.

5. The analog to digital converter of claim 1, wherein the transfer unit comprises:
a same number of transfer gates as the number of the reference voltages outputted by the reference voltage generating unit, and
wherein a transfer gate turns on when the decoding signal corresponding to the transfer gate is enabled.

6. The analog to digital converter of claim 1, wherein the transfer unit comprises:
a first transfer unit transferring a central reference voltage of the M reference voltages; and
a second transfer unit transferring remaining M reference voltages according to the decoding signal.

7. The analog to digital converter of claim 1, wherein an upper most bit to an N−1 bit of the N-bit digital signal outputted by the output unit is fed back to the decoding unit to output $2^N-2$ decoding signals.

8. The analog to digital converter of claim 1, wherein the decoding unit comprises N−1 decoders and each of the decoders receives a sequentially accumulated digital signal from an upper most bit to lower bits of the N-bit digital signal.

9. The analog to digital converter of claim 1, wherein the output unit comprises:
a same number of comparators as the N number of reference voltages outputted by the reference voltage selecting unit, and
wherein the each of the comparators compares a corresponding reference voltage with the externally inputted analog input signal to output the comparison result.

10. The analog to digital converter of claim 9, wherein the comparator comprises:
a first operational amplifier including an NMOS transistor differential input pair;
a second operational amplifier including a PMOS transistor differential input pair;
an operational amplifier drive selecting unit alternatively turning off the first operational amplifier and the second operational amplifier according to a voltage level of the externally inputted analog input signal; and
a transfer gate corresponding to each operational amplifier to selectively transfer outputs of the operational amplifiers.

11. The analog to digital converter of claim 10, wherein the operational amplifier drive selecting unit comprises:
a first inverter inverting the externally inputted analog input signal to output it as a first driving signal of the second operational amplifier; and
a second inverter inverting the first driving signal of the first inverter to output it as a second driving signal of the first operational amplifier.

12. An analog to digital converter, comprising:
a reference voltage transfer unit receiving a plurality of reference voltages and transferring N number of reference voltages in response to a control signal (N being a natural number);
a comparing unit comparing N number of reference voltages outputted by the reference voltage transfer unit with an externally inputted analog input signal to output a comparison result as an N-bit digital signal; and
a control signal generating unit generating the control signal by from the N-bit digital signal,
wherein the reference voltage transfer unit comprises:
a same number of transfer gates as the number of the reference voltages received by the reference voltage transfer unit, and
wherein the transfer gates turn on when the control signal is enabled.

13. The analog to digital converter of claim 12, wherein the reference voltage transfer unit comprises:
a first transfer unit transferring a reference voltage having a central voltage level among the plurality of reference voltages; and
a second transfer unit transferring remaining reference voltages of the plurality of reference voltages according to the control signal.

14. The analog to digital converter of claim 12, wherein the control signal generating unit receives an upper most bit to an N−1 bit of the N-bit digital signal and outputs $2^N-2$ control signals.

15. The analog to digital converter of claim 12, wherein the control signal generating unit comprises N−1 decoders and each decoder receives a sequentially accumulated digital signal from an upper most bit to lower bits of the N-bit digital signal.

16. The analog to digital converter of claim 12, wherein the comparing unit comprises N number of comparators and each of the comparators compares a corresponding reference voltage with the externally inputted analog input signal to output the comparison result.

17. The analog to digital converter of claim 16, wherein the comparator comprises:
a first operational amplifier including an NMOS transistor differential input pair;
a second operational amplifier including a PMOS transistor differential input pair;
an operational amplifier drive selecting unit alternatively turning off the first operational amplifier and the second operational amplifier according to a voltage level of the externally inputted analog input signal; and
a transfer gate corresponding to each of the operational amplifiers.

18. The analog to digital converter of claim 16, wherein the operational amplifier drive selecting unit comprises:
a first inverter inverting the externally inputted analog input signal to output it as a first driving signal of the second operational amplifier; and
a second inverter inverting the first driving signal of the first inverter to output it as a second driving signal of the first operational amplifier.

* * * * *